(12) United States Patent
Zhuang et al.

(10) Patent No.: US 8,790,603 B2
(45) Date of Patent: Jul. 29, 2014

(54) APPARATUS FOR PURIFYING A CONTROLLED-PRESSURE ENVIRONMENT

(71) Applicant: KLA-Tencor Corporation, Milpitas, CA (US)

(72) Inventors: Guorong V. Zhuang, Santa Clara, CA (US); Gildardo Delgado, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/924,859

(22) Filed: Jun. 24, 2013

(65) Prior Publication Data
US 2014/0004025 A1    Jan. 2, 2014

Related U.S. Application Data

(60) Provisional application No. 61/665,025, filed on Jun. 27, 2012.

(51) Int. Cl.
| | |
|---|---|
| *B01D 7/00* | (2006.01) |
| *B01D 53/00* | (2006.01) |
| *B01D 53/74* | (2006.01) |
| *F04B 53/00* | (2006.01) |
| *G05D 99/00* | (2006.01) |

(52) U.S. Cl.
USPC ........... 423/210; 422/109; 422/111; 422/168; 422/198; 417/53; 417/572

(58) Field of Classification Search
USPC .................. 423/210; 422/109, 111, 168, 198; 417/53, 572
See application file for complete search history.

(56) References Cited

U.S. PATENT DOCUMENTS

| | | | |
|---|---|---|---|
| 3,364,654 A * | 1/1968 | Westbrock | ...................... 95/116 |
| 4,512,960 A | 4/1985 | Szwarc | |
| 6,724,460 B2 | 4/2004 | Van Schaik et al. | |
| 6,772,776 B2 | 8/2004 | Klebanoff et al. | |
| 7,604,906 B1 | 10/2009 | Volk et al. | |
| 8,097,092 B2 | 1/2012 | Derra et al. | |
| 2009/0014666 A1 | 1/2009 | Zink et al. | |

OTHER PUBLICATIONS

Esposto, F. J., K. Griffiths, P.R. Norton and R.S. Timsit. "Simple Source of Li Metal for Evaporators in Ultrahigh Vacuum (UHV) Applications." J. Vac. Sci. Technol. A 12(6), Nov./Dec. 1994, (Jul. 25, 1994), pp. 3245-3247; http://scitation.aip.org/getpdf/servlet/GetPDFServlet?filetype=pdf&id=JVTAD6000012000006003245000001&idtype=cvips&doi=10.1116/1.579246&prog=normal.

(Continued)

*Primary Examiner* — Timothy Vanoy
(74) *Attorney, Agent, or Firm* — Simpson & Simpson, PLLC

(57) ABSTRACT

An apparatus for purifying a controlled-pressure environment in a chamber, including: a piece of lithium-aluminum alloy located in the chamber; an activation element arranged to impart energy to the piece of lithium-aluminum alloy to sublimate lithium from the piece of lithium-aluminum alloy; a feedback control system including a sensor system arranged to measure a condition within the chamber, and a controller in communication with the sensor and configured to control operation of the activation element according to an evaluation of the condition; and a collection plate located in the chamber and arranged to form a layer of the sublimated lithium on a surface of the collection plate.

30 Claims, 5 Drawing Sheets

(56) References Cited

OTHER PUBLICATIONS

Rendek, Jr., Louis, Gary S. Chottiner and Daniel A. Scherson. "The Reactivity of Lithium Toward Propylene Carbonate in Ultrahigh Vacuum: A Combined IRAS, AES and XPS Study," Departments of Chemistry and Physics, Case Western Reserve University, Cleveland, Ohio 44106; Proceedings—Electrochemical Society PV; 1999, 15, pp. 45-50.

Dewald, A.B., P.A. Scott, J.Chu and A.R. Krauss. "Review of Recent Developments in Lithium Metal-Bearing Alloys and Composites for In-Vessel Fusion Applications," Journal of Nuclear Materials, vol. 176-177, Dec. 3, 1990, pp. 848-855; http://www.sciencedirect.com/science/article/pii/002231159090156H.

SAES Getter Brochure: Alkali Metal Dispensers (http://www.saesgetters.com/documents/AMD%20Brochure_1789.pdf) 2007.

McAlister, A.J. "The Al—Li (Aluminum—Lithium) System," Bulletin of Alloy Phase Diagrams, vol. 3, No. 2, 1982, pp. 177-183.

Schorn, R.P., E. Hintz, S. Musso and B. Schweer. "A compact thermal lithiumbeam source using a solid Al/Li alloy for Li sublimation," Review of Scientific Instruments, 60, 3275, 1989.

Zavadil, K.R. and N.R. Armstrong. "Surface chemistries of lithium: Detailed characterization of the reactions with O2 and H2O using XPS, EELS, and microgravimetry," Department of Chemistry, The University of Arizona, Tucson, AZ 85721, USA; Surf. Sci.,230, 47(1990). (Li surface reaction with H2O, O2, SiO2).

Zhuang, Guorong, Kuilong Wang, P.N. Ross, Jr. "XPS characterization of the reaction of Li with tetrahydrofuran and propylene carbonate," Surf. Sci.,387, 199-212 (1997).

Zhuang, G.R., K. Wang, Y. Chen and P.N. Ross, Jr. "Study of the reactions of Li with tetrahydrofuran and propylene carbonate by photoemission spectroscopy," J. Vac. Sci. Technol. A 16(5), Sep./Oct. 1998 pp. 3041-3045.

Zhuang, Guorong, Yufeng Chen, Philip N. Ross, Jr. "The reaction of lithium with carbon dioxide studied by photoelectron spectroscopy." Suit Sci., 418, 139-149 (1998).

Zhuang, Guorong, Philip N. Ross, Jr. Fan-ping Kong and Frank McLarnon. "The Reaction of Clean Li Surfaces with Small Molecules in Ultrahigh Vacuum." J. Electrochem. Soc. Vol. 145, No. 1, Jan. 1998 pp. 159-164.

Zhuang, Guorong, Yufeng Chen, and Philip N. Ross, Jr. "The Reaction of Lithium with Dimethyl Carbonate and Diethyl Carbonate in Ultrahigh Vacuum Studied by X-ray Photoemission Spectroscopy." Langmuir 1999, 15, 1470-1479.

\* cited by examiner

APPARATUS FOR PURIFYING A CONTROLLED-PRESSURE ENVIRONMENT

CROSS-REFERENCE TO RELATED APPLICATIONS

This application claims the benefit under 35 U.S.C. §119(e) of U.S. Provisional Patent Application No. 61/665,025, filed Jun. 27, 2012, which application is incorporated herein by reference.

TECHNICAL FIELD

The present disclosure relates to an apparatus and method for purifying a controlled-pressure environment, for example, an apparatus and method using a feedback control system to sublimate lithium in a vacuum chamber and a cooled collection plate in the vacuum chamber. Contaminants in the chamber react with the sublimated lithium and/or condense on the collection plate to remove the contaminants in the chamber. The present disclosure also relates to a vacuum pump and method using a purifying system to place sublimated lithium in a gas flow for the pump to increase a speed at which vacuum is created by the pump.

BACKGROUND

It is known to inspect semi-conductor components in an "ultraclean vacuum" (UCV) environment using extreme ultra-violet (EUV) light with a wavelength of 13.5 nm. A very low level of contaminants in the vacuum environment is necessary to obtain a desired operational life of a UCV/EUV inspection system. Specifically, components, such as optics and sensors, in the UCV/EUV inspection system must kept clean and the thickness of carbon or oxidation layers (haze) on the components must be held to no more than about 2 or 3 nm. For example, typical requirements for a UCV/EUV inspection system are contaminant levels in a range of 1-100 parts per trillion, high total pressure (0.1-10 Pa) with extreme low partial pressures of contaminants (~10-12 mbar), and water partial pressure below $10^{-7}$ mbar.

However, haze formation on deep ultra-violet (DUV) and EUV optics and masks is a common problem. Various types of ammonium salts are typically identified as haze forming species; most common are ammonium sulfate, ammonium nitrate, ammonium phosphates, ammonium oxylate, and chlorine. In addition, organics and siloxanes are identified as haze formation species as well. It is known in the art that merely controlling and eliminating one type of the haze formation precursor and species results in the appearance of another type.

The performance of UCV/EUV inspection systems degrades at an unacceptable rate due to oxide formation and carbonaceous layer accumulation on surface of key components accelerated by DUV or EUV stimulated surface reaction in the presence of contaminants. That is, during operation of inspection systems, critical optical components (mirrors, windows, sensors/detectors) and surfaces including chamber walls must be clean to prevent deposition of contaminants. Thus, precise control of contaminant levels, for example of hydrocarbons, acids, bases, $H_2O$, and $O_2$, enhances cleanliness of a UCV/EUV inspection system and maximizes the life of components in the system. The sources of contaminates are from the inspection system itself and from contaminates in the system components.

It is known to use capping layers to minimize oxidation and contamination built up on components in a EUV inspection system. For example, the components are protected by a Ruthenium capping layer. However, under the typical operating conditions for a EUV inspection system, Ruthenium is still highly prone to oxidation and carbonaceous species built-up.

Conventional "ultra-high vacuum" (UHV) approaches, such as multi-stage pumping and high temperature baking, are used to reduce the respective partial pressures of $O_2$, $H_2O$ and hydrocarbons. However, such methods are not feasible for UCV/EUV inspection systems. Specifically, key components in an UCV/EUV inspection system are damaged by the elevated temperature associated with high temperature baking It is known to maintain cleanness of inspection systems by prequalifying material used in the system, rigorously cleaning and outgassing prequalified material, and maintaining the system under inert gas purged environment with specified $O_2$, $H_2O$ content, and control of impurities, such as hydrocarbons, acids, bases, via filters. The preceding methods are not particularly effective and are cumbersome to implement. It also is known to directly evaporate alkali metal on a chamber surface. The thin film of the metal acts as a getter, slowly react with impurities. The alkali metal film is formed from liquid phase from alkali metal evaporation. However, the evaporation rate is difficult to control and liquid alkali metal is highly corrosive and mobile. The metal film formed has low purity since it is difficult to clean the target. It is known to use a mixture of alkali metal chromate with a reducing agent. However, this method results in a limited supply of alkali metal (the getter) and generates undesired by-products when releasing alkali metal.

SUMMARY

According to aspects illustrated herein, there is provided an apparatus for purifying a controlled-pressure environment in a chamber, including: a piece of lithium-aluminum alloy located in the chamber; an activation element arranged to impart energy to the piece of lithium-aluminum alloy to sublimate lithium from the piece of lithium-aluminum alloy; a feedback control system including a sensor system arranged to measure a condition within the chamber, and a controller in communication with the sensor and configured to control operation of the activation element according to an evaluation of the condition; and a collection plate located in the chamber and arranged to form a layer of the sublimated lithium on a surface of the collection plate.

According to aspects illustrated herein, there is provided an apparatus for purifying a controlled-pressure environment, including: a chamber arranged to be evacuated to create the controlled-pressure environment in the chamber; a piece of lithium-aluminum alloy located in the chamber; an activation element arranged to impart energy to the piece of lithium-aluminum alloy to sublimate lithium from the piece of lithium-aluminum alloy; a collection plate located in the chamber and arranged to form a layer of the sublimated lithium on a surface of the collection plate; and a cooling system connected to the collection plate and arranged to reduce a temperature of the collection plate below an ambient temperature in the chamber. The collection plate is arranged to condense, on the collection plate, a contaminant in the chamber.

According to aspects illustrated herein, there is provided a vacuum pump, including: an inlet; an outlet; a flow path from the inlet to the outlet; a pumping mechanism configured flow gas through the flow path and reduce a pressure of the flowing gas; and a purifying system including a piece of lithium-aluminum alloy, and an activation element arranged to impart energy to the piece of lithium-aluminum alloy to sublimate lithium from the piece of lithium-aluminum alloy into the flow path.

According to aspects illustrated herein, there is provided a method for purifying a controlled-pressure environment in a chamber using an apparatus including an activation element and a feedback control system, including: evaluating, using a sensor system in the feedback control system, a condition in the chamber; imparting, using the activation element, energy to a piece of lithium-aluminum alloy located in the chamber; controlling, using a controller in the feedback control system, the imparting of the energy to the piece of lithium-aluminum alloy according to evaluation of the condition; sublimating lithium from the piece of lithium-aluminum alloy; forming a layer of the sublimated lithium on a collection plate located in the chamber; and reacting the sublimated lithium with the contaminant.

According to aspects illustrated herein, there is provided a method for purifying a controlled-pressure environment in a chamber using an apparatus including an activation element, a collection plate located in the chamber, and a cooling system, including: imparting, using the activation element, energy to a piece of lithium-aluminum alloy located in the chamber; sublimating lithium from the piece of lithium-aluminum alloy; forming a layer of the sublimated lithium on the collection plate; cooling, using the cooling system, the collection plate to a temperature below an ambient temperature in the chamber; condensing, on the collection plate, a first contaminant in the chamber; and reacting the sublimated lithium with a first contaminant or a second contaminant in the chamber.

According to aspects illustrated herein, there is provided a method of operating a vacuum pump, including: flowing gas through a flow path from an inlet of the vacuum pump to an outlet of the vacuum pump; reducing a pressure of the flowing gas; imparting energy to a piece of lithium-aluminum alloy; sublimating lithium from the piece of lithium-aluminum alloy into the flow path; and reacting a contaminant in the flowing gas with the sublimated lithium.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements of the disclosure. It is to be understood that the disclosure as claimed is not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure.

Figure 1:
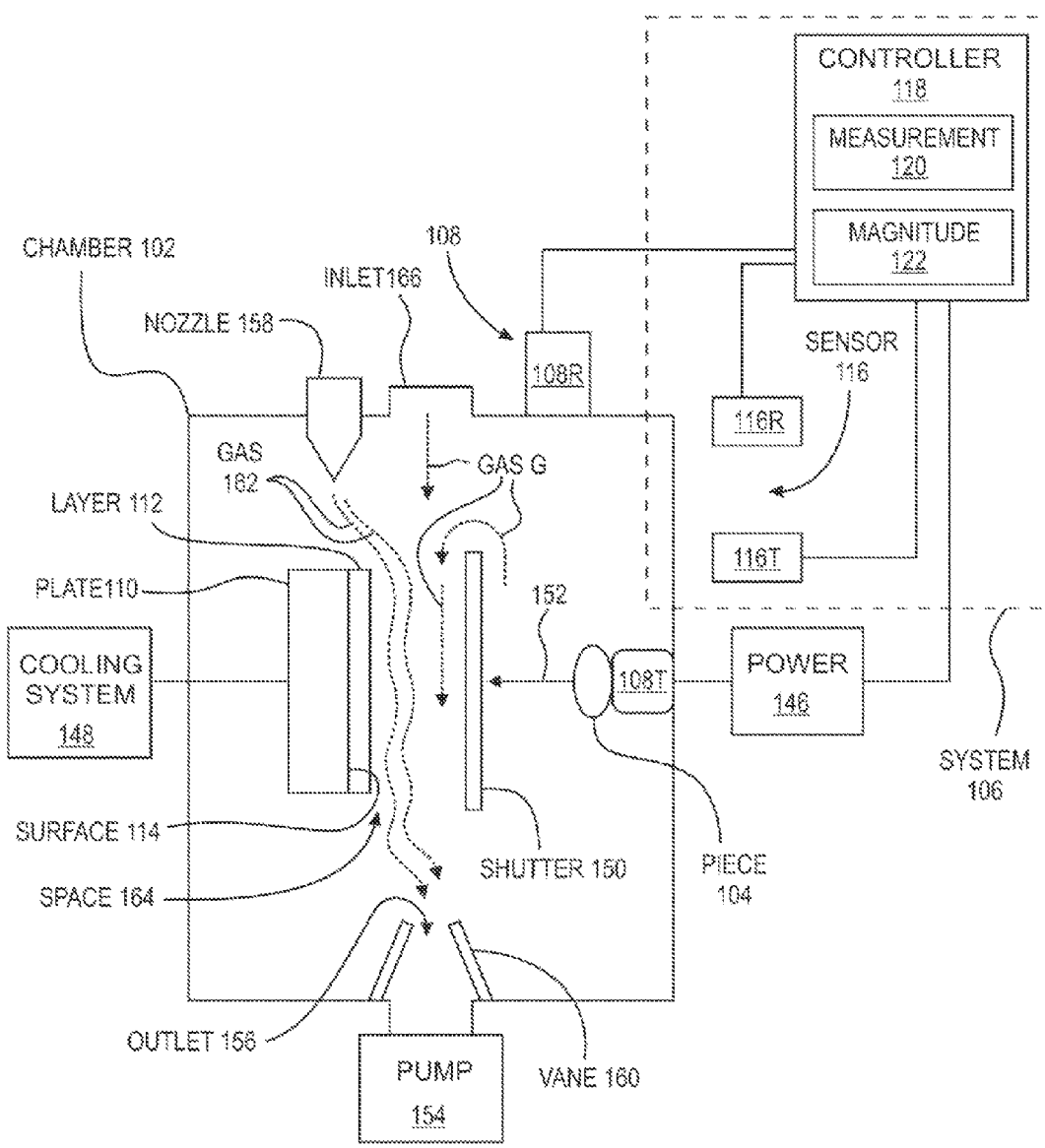
FIG. 1 is a schematic side view of an apparatus, for purifying a controlled-pressure environment, with a shutter in an open position.

FIG. 1 is a schematic side view of apparatus 100, for purifying a controlled-pressure environment, with a shutter in an open position.

Figure 2:
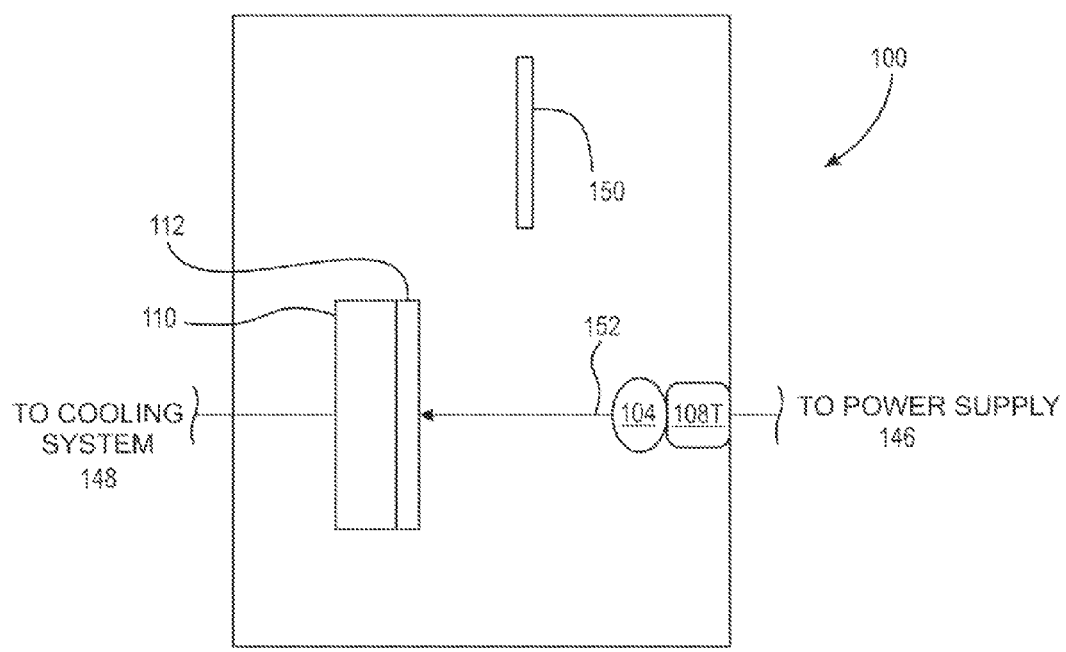
FIG. 2 is a schematic top view of a chamber of the apparatus shown in FIG. 1.

FIG. 2 is a schematic top view inside a chamber of the apparatus shown in FIG. 1. The following should be viewed in light of FIGS. 1 and 2. Apparatus 100 includes chamber 102, piece 104 of lithium-aluminum alloy located in the chamber, feedback control system 106, activation element 108, and collection plate 110 located in the chamber. In an example embodiment, chamber 102 is arranged to be evacuated to create the controlled-pressure environment in chamber 102. By "evacuate" we mean to reduce the pressure in the chamber to below atmospheric pressure. By "controlled-pressure environment" we mean a pressure within chamber from just below atmospheric pressure to a highest level of vacuum known in the art, for example, $10^{-11}$ torr. Activation element 108 is arranged to impart energy to piece 104 to sublimate lithium from piece 104 and collection plate 110 is arranged to form layer 112 of sublimated lithium on surface 114 of collection plate 110. As further described below, layer 112 is arranged to react with residuals in the chamber or a contaminant in gas G flowing through chamber 102. In an example embodiment, piece 104 is about 6% lithium by atomic weight. In an example embodiment, piece 104 is up to 15% lithium by atomic weight.

Feedback control system 106 forms a closed-loop system including sensor system 116 and control element 118 in communication with sensor 116. Sensor system 116 is configured to measure a condition within chamber 102. By "in communication with" we mean that sensor 116 is able to transmit a signal to controller 118 by any means known in the art, for example, by a hardwire connection or by a wireless connection. In general, controller 118 is configured to regulate activation element 108 to control a rate of sublimation of lithium from piece 104 according to feedback from sensor 116, for example according to data, regarding the evaluation of the condition, transmitted from sensor system 116 to controller 118.

In an example embodiment, sensor system 116 includes residue sensor 116R and the condition is a presence of a contaminant in chamber 102. For example, sensor 116R is configured to measure the contaminant present in the chamber. Controller 118 is configured to control operation of activation element 108 according to the measurement 120 of the contaminant in chamber 102. In an example embodiment, controller 118 is configured to operate activation element 108 to impart magnitude of energy 122 to piece 104 for measurement 120A (measured value) of the contaminant in chamber 102; and operate activation element 108 to impart magnitude of energy 124, greater than magnitude of energy 12, to piece 104 for measurement 120B of the contaminant in the chamber greater measurement 120A. Thus, system 106 adapts sublimation of lithium from piece 104 according to a level of contamination in chamber 102. In an example embodiment, the controller is configured to activate element 108 when measurement 120 exceeds set point 126, and is configured to deactivate element 108 when measurement 120 falls below set point 128.

In an example embodiment, sensor system 116 includes temperature sensor 116T and the condition is a temperature, or activation level, of piece 104, that is, sensor 116T is configured to measure a temperature of piece 104. Control element 118 is configured to control operation of activation element 108 according to measured temperature 130 of piece 104. In an example embodiment, controller 118 is configured to activate activation element 108 when measured temperature 130 falls below set point 132, and is configured to activate activation element 108 when measured temperature 130 exceeds set point 134.

In an example embodiment, sensor system 116 includes residue sensor 116R and temperature sensor 116T. The controller is configured to: activate activation element 108 when measurement 120 exceeds set point 136; determine target temperature 138 according to measurement 120; and deactivate activation element 108 when measured temperature 130 exceeds target temperature 138.

Thus, system 106 can operate element 108 in an on-off (digital/binary signal) mode or in an analog mode.

In an example embodiment, controller 118 includes timer 140 configured to operate element 118 for predetermined duration 142 at predetermined time interval 144. Timer 140 can be any timer known in the art. In an example embodiment, timer 140 is configured such that measurement 120 or measured temperature 126 can override duration 142 or interval 144. For example, if measurement 120 exceeds set point 126, controller 118 activates element 118 regardless of interval 144.

Any activation element known in the art can be used for activation element 108. In an example embodiment, activation element 108 includes thermal source 108T. In an example embodiment, source 108T is located in chamber 102 and is in contact with piece 104. Power supply 146 for source 108T is located outside of chamber 102. In an example embodiment, activation element 108 includes radiation source 108R. In an example embodiment, source 108R is located outside of chamber 102 and radiation from source 108R passes through chamber 102 to piece 104. In an example embodiment, source 108R is a laser or heating lamp, for example, an infra-red laser or an infra-red heating lamp. In an example embodiment, source 108T is a resistive heating element.

In an example embodiment, apparatus 100 includes cooling system 148 arranged to reduce a surface temperature of collection plate 110. Due to the reduced surface temperature, collection plate 110 is arranged to condense, on the collection plate, a contaminant in gas G. System 148 can be any system known in the art, including, but not limited to a thermal electric device, a liquid nitrogen reservoir, or a reservoir compatible with a mixture of dry ice and organic solvents. System 148 can be used to cool collection plate 110 prior to sublimating lithium from piece 104, while sublimating lithium from piece 104, or after sublimating lithium from piece 104.

In an example embodiment, apparatus 100 includes displaceable shutter 150 located within chamber 102. In the open position of FIGS. 1 and 2, shutter 150 is not located between plate 110 and piece 104, that is, direct line 152 is present between piece 104 and collection plate 110. The position of shutter 150 and the presence of line 152 enable sublimated lithium from piece 104 to transit to collection plate 110 to form layer 112. Any shutter known in the art can be used for shutter 150 and any means known in the art can be used to displace shutter 150. In an example embodiment, apparatus 100 includes vacuum pump 154 operatively connected to outlet port 156. Pump 154 is configured to evacuate chamber 102.

In an example embodiment, apparatus 100 includes gas nozzle 158 and at least one collection wall, funnel, or vane 160 proximate outlet port 156. Nozzle 158 is used to introduce purified carrier gas 162, such as hydrogen, helium, argon, or other inert gas or mixtures thereof to chamber 102. Collection wall, funnel, or vane 160 is used to guide carrier gas 162 and gas G to outlet port 156. Clean carrier gas 162 passes through area 164 between piece 104 and collection plate 110 and brings contaminants in chamber 102, for example in gas G, downstream to outlet 156 and pump 154. In an example embodiment, chamber 102 includes inlet port 166 used to introduce a gas into chamber 102 for purification.

Figure 3:
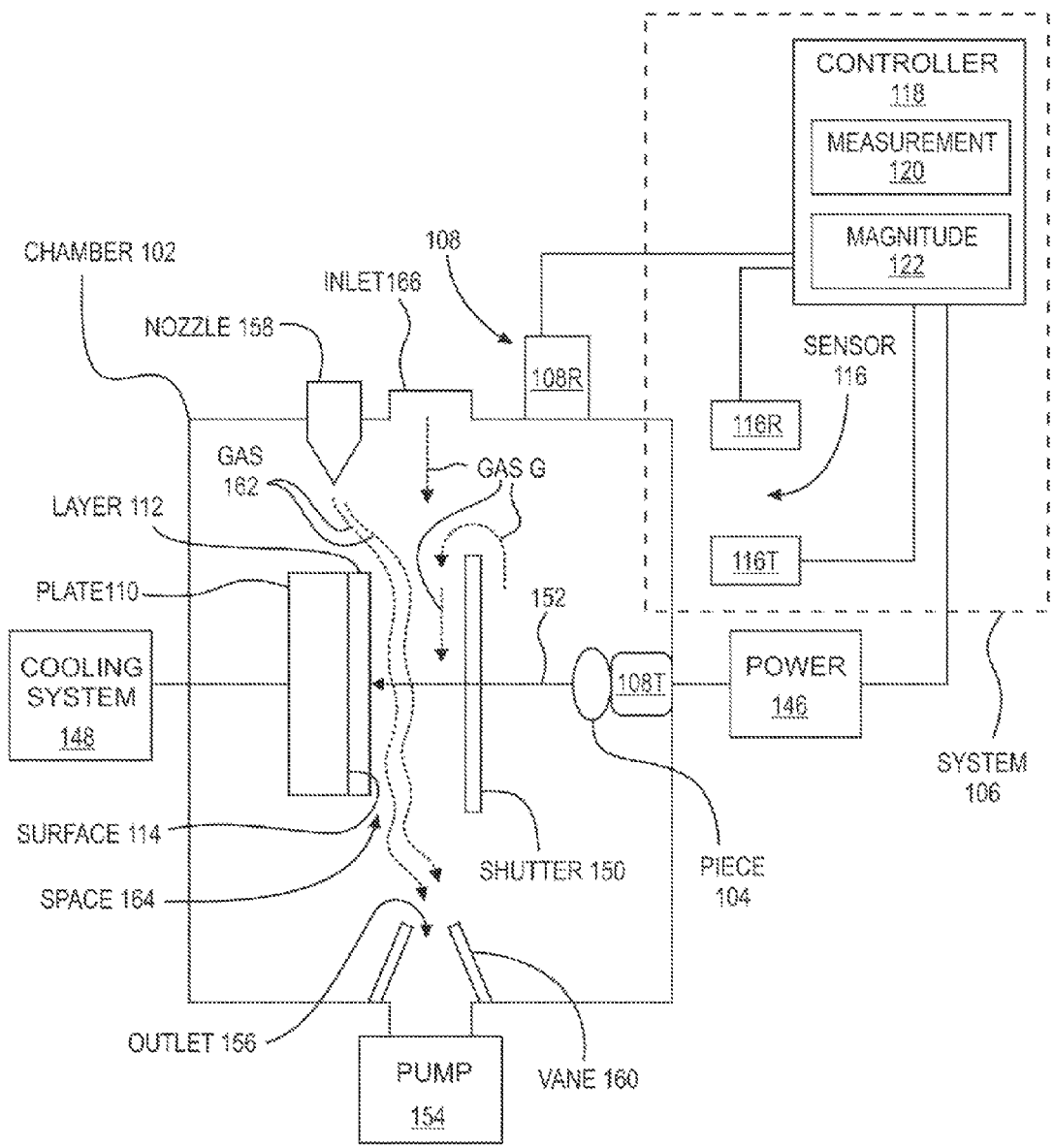
FIG. 3 is a schematic side view of the apparatus shown in FIG. 1 with the shutter in a blocking position.

FIG. 3 is a schematic side view of apparatus 100 shown in FIG. 1 with shutter 150 in a blocking position.

Figure 4:
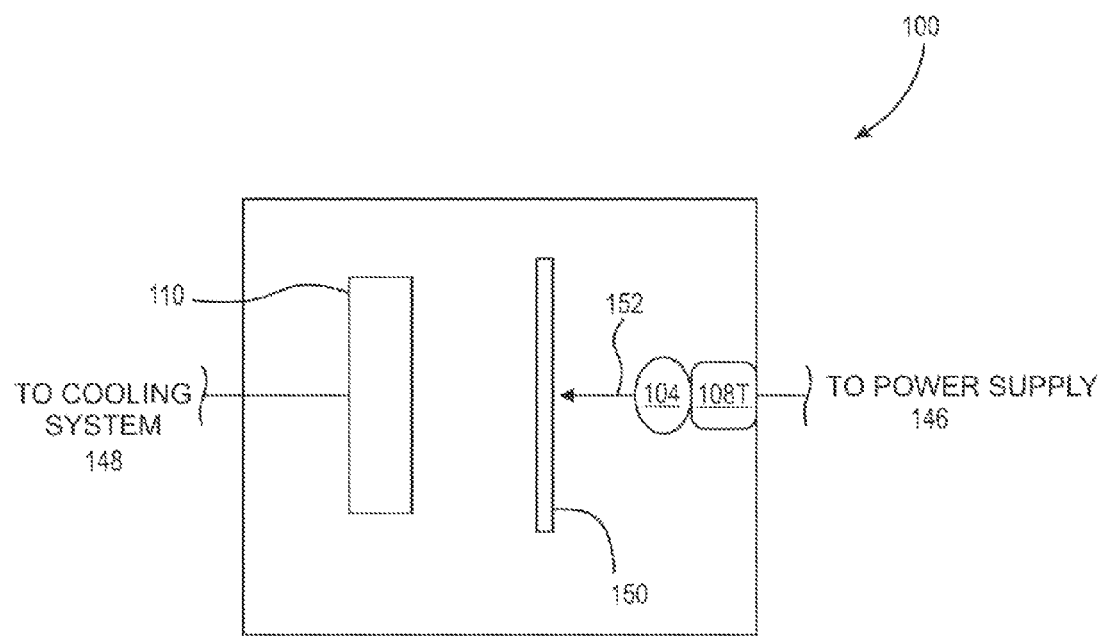
FIG. 4 is a schematic top view of the chamber of the apparatus shown in FIG. 3.

FIG. 4 is a schematic top view of chamber 102 of apparatus 100 shown in FIG. 3. In the blocking position shown in FIGS. 3 and 4, shutter 150 is between piece 104 and plate 110 and blocks direct line 152. That is, shutter 150 blocks straight lines connecting piece 104 and plate 110 and is arranged to intercept material emitted from piece 104 to prevent the material from reaching plate 110. For example, the first time piece 104 is used in apparatus 100, piece 104 must be pre-conditioned and off-gassed to remove surface contaminants on piece 104 that could contaminate layer 112 or inhibit sublimation of lithium from piece 104. To out-gas, that is, eliminate, the contaminants absorbed on surface due to exposure to ambient environment, piece 104 is heated. Prior to initiating the out-gassing procedure, shutter 150 is placed in the blocking mode to intercept the off-gassed contaminants that would otherwise collect on collection plate 110. The out-gassing procedure also is followed after exposing piece 104 to atmosphere or other conditions which result in contamination build-up on piece 104. For example, such exposure can occur when chamber 102 is opened for maintenance operations.

Figure 5:
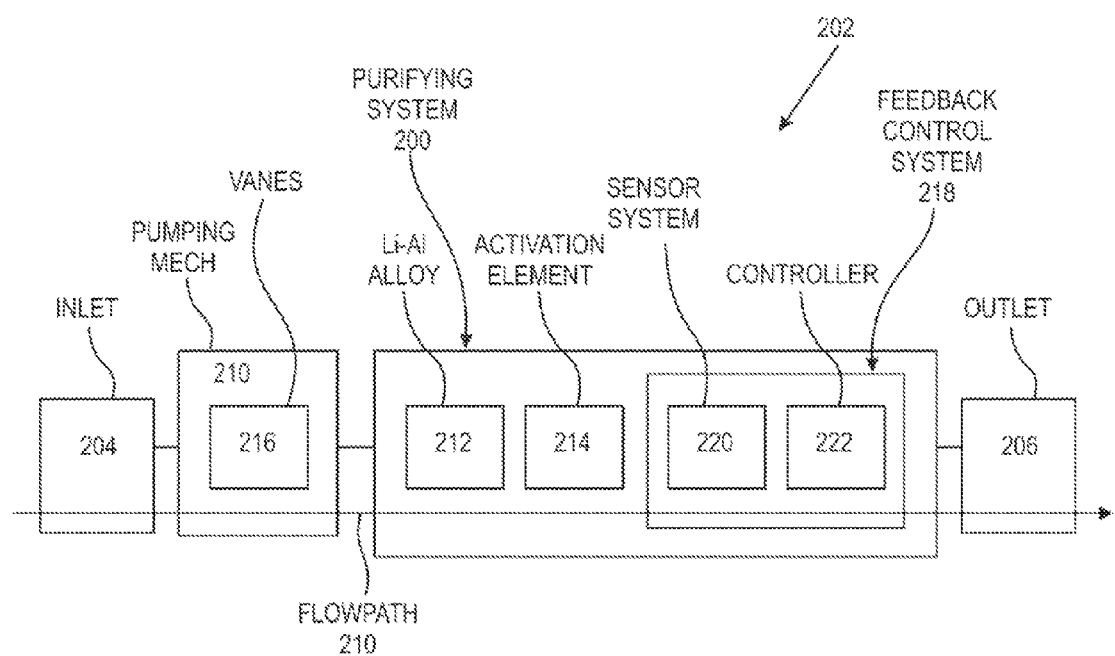
FIG. 5 is a schematic block diagram of a vacuum pump with a purifying system.

FIG. 5 is a schematic block diagram of a vacuum pump with purifying system 200. Vacuum pump 202 includes inlet 204, outlet 206, flow path 208 from the inlet to the outlet, and pumping mechanism 210 configured to flow gas through the flow path and reduce a pressure of the flowing gas. Purifying system 200 including piece 212 of lithium-aluminum alloy and activation element 214 arranged to impart energy to piece 212 to sublimate lithium from piece 212 into flow path 208. In the example embodiment of FIG. 5, pump 202 is a turbo molecular vacuum pump; however, it should be understood that system 200 is usable with any vacuum pump known in the art.

The discussion regarding piece 104 and activation element 108 is generally applicable to piece 212 and element 214. Thus, element 214 is configured to impart energy to piece 212 to sublimate lithium from piece 212. In an example embodiment, unlike apparatus 100, system 200 does not include a component analogous to collection plate 110 and the sublimated lithium is mobile within flow path 210 to react with contaminants in flow path 210.

In general, a vacuum pump creates a vacuum by removing contaminants from a space being evacuated. Applicable contaminants are described infra and supra. Advantageously, system 200 increases the rate at which pump 202 removes contaminants by augmenting the known vacuum-creating function of the pump, for example, the action of vanes 216 in turbo molecular pump 202. Specifically, by reacting with the contaminants the lithium forms non-volatile oxide compounds and other organo-metallic compounds that are more easily removed from flow path 210 than are the contaminants in their native state.

In FIG. 5, system 200 is shown proximate outlet 206. However, it should be understood that system 200 can be placed anywhere within flow path 208 or in fluid communication with flow path 210. In an example embodiment, system 200 includes feedback control system 218 including sensor system 220 and controller 222. The discussion regarding feedback control system 106, sensor system 108, and controller 118 is generally applicable to feedback control system 218 including sensor system 220 and controller 222, respectively.

Apparatus 100 can be used in any pressure-controlled environment application known in the art. For example, apparatus 100 can operate continuously to achieve and maintain a desired clean vacuum or any high purity chamber with pressurized clean gases during commission, operation, standby, storage, or transport of an inspection system. In addition, the elements 104 in combination with 108 can act as passive pumping unit to maintain a pre-evacuated environment in a container; that is, not flowing a gas through the chamber, for storing and shipping sensitive components such as optical components.

The following provides further detail regarding apparatus 100. Feedback control system 106 is a novel component for systems removing contaminants from controlled-pressure environments, such as an inspection system for semi-conductor components in an "ultraclean vacuum" (UCV) environment using extreme ultra-violet (EUV) light. As a fresh outer layer of sublimated lithium in layer 112 reacts with contaminants, an oxide layer forms on the outer surface of layer 112. Since the oxide layer has a certain degree of porosity, the presence of the layer does not inhibit the reaction of the sublimated lithium with contaminants. However, it is desirable to make layer 112 as thin as possible, ideally one atom of lithium thick, and then add fresh layers of sublimated lithium as oxide layers are formed to increase the speed of the reaction process.

Advantageously, feedback control system 106 enables a dynamic control of the sublimation process, based on actual conditions in chamber 102, to ensure a maximum efficacy of the contaminant reaction process. Further, system 106 extends the usable life of piece 104 by ensuring that only the minimal amount of sublimation occurs to address contaminant conditions in chamber 102. For example, without the use of system 106, a relatively thick layer of sublimated lithium would need to be deposited on the collection plate to ensure that adequate material is available for reaction. However, as noted above, oxidation of the surface of the lithium layer would reduce the efficiency of the reaction process. Stated otherwise, lithium "buried" under the oxidation layer is underutilized for contaminant reaction.

However, using system 106, a relatively thin layer of lithium is deposited to form layer 112 as needed. Residue sensor 108R provides feedback indicating the level of contamination in chamber 102. According to level of contamination, controller 118 determines whether it is necessary to activate piece 104 to add more fresh lithium to layer. Thus, successive thin layers of lithium are added, optimizing reaction rates and optimizing use of piece 104, for example, minimizing the amount of lithium "buried" under the oxidation layer. Without system 106, lithium 106 is blindly sublimated, which leads to either excessive sublimation and inefficient use of piece 104 or insufficient sublimation and unnecessarily slow contaminant removal.

Further, temperature sensor 108T enables precise control of the sublimation process. For example, based on feedback from sensor 108R, the controller determines a desired rate of sublimation and uses feedback from sensor 108T to control power to the activation element to attain the desired rate. For example, activating piece 108T at higher temperatures when a faster rate of lithium sublimation is desired.

Advantageously, the heretofore unknown combination of layer 112 with the reduced temperature of collection plate 110 also removes contaminants, typically medium and high molecular weight compounds having medium or low respective vapor pressures. Such contaminants include, but are not limited to SiOx, siloxanes, plasticizers such as phthalates, benzenes and long chained molecules (boiling point>120° C., molecular mass>120 g/mol), especially those which contain carbonyl groups. These medium and high molecular weight compounds, even in very low quantity, can build up on optical element surfaces readily due to their high sticking coefficient. In known systems, the removal of these medium and high molecular weight compounds having medium or low respective vapor pressures is difficult, for example, because it is difficult to attract these compounds and to trap these compounds on a lithium layer. However, the reduced temperature of the collection plate attracts these compounds to the collection plate and causes these compounds to condense on the collection plate. After the compounds are condensed on the collection plate, piece 104 is activated to produce sublimated lithium while the temperature of the collection plate is increased. Thus, the condensed contaminants react with sublimated lithium on surface 114 at elevated temperature, less than the temperature in the rest of the chamber, to prevent the condensed compounds from leaving surface 114 before forming non-volatile organo-metallic compounds.

Apparatus 100 can be used in conjunction with a variety of systems including, but not limited to UCV/EUV, deep ultra-violet (DUV), e-beam, and high vacuum article or wafer inspection systems. Typical components of an inspection system protected from contaminant build-up by apparatus 100 include, but are not limited to an optical module, masks, TDI (Time Delay Integration), purity filters, multilayer mirrors, and sensors. Layer 112 effectively protects active regions of sensitive components in an inspection system by absorbing the critical constituents of haze causing contaminants, thereby making the contaminants unavailable for reaction.

Apparatus 100 provides at least the following advantages. The following list is directed to an inspection system; however, it should be understood that the advantages of apparatus 100 are not limited to use with an inspection station:

1. Reduced down time for maintenance and cleaning of components in an inspection system, increasing availability of the inspection system.

2. Increased life-span for components in the inspection system.

3. Reduced pump down times.

4. Reduced setup time during installation of an inspection system, because optics in the system do not require extended purging prior to being exposed to system illumination.

5. Optimized performance of the inspection system since operation below required tolerance levels due to contaminated components is reduced.

6. Reduced stabilization time due to optic surfaces not requiring prolonged pump down time to clean exposed surfaces.

7. Increased installation schedule flexibility due to the elimination of the requirement to get internal optical purge assembly for an inspection system functioning immediately upon arrival.

8. Relatively inexpensive to implement.

9. Piece 104 is easily machined to a desired size and geometry for mounting inside chamber 102 at an optimum location. Piece 104 can be a separate wall mounted or stand-alone structure within chamber 102, can be a removable ribbon, sheet or structure within chamber 102, can be a coating on a surface, or can be made part of operational components of a system to be protected, for example, part of a framework for such a component.

It will be appreciated that several of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus for purifying a controlled-pressure environment in a chamber, comprising:
    a piece of lithium-aluminum alloy located in the chamber;
    an activation element arranged to impart energy to the piece of lithium-aluminum alloy to sublimate lithium from the piece of lithium-aluminum alloy;
    a feedback control system including;
        a sensor system arranged to measure a condition within the chamber; and,
        a controller in communication with the sensor and configured to control operation of the activation element according to an evaluation of the condition; and,
    a collection plate located in the chamber and arranged to form a layer of the sublimated lithium on a surface of the collection plate.

2. The apparatus of claim 1, wherein:
    the sensor system includes a residue sensor; and,
    the condition includes a presence of a contaminant in the chamber.

3. The apparatus of claim 2, wherein the controller is configured to:
    operate the activation element to impart a first magnitude of energy to the piece of lithium-aluminum alloy for a first measured value, from the residue sensor, of the contaminant in the chamber; and,
    operate the activation element to impart a second magnitude of energy, greater than the first magnitude of energy, to the piece of lithium-aluminum alloy for a second measured value, from the residue sensor, of the contaminant in the chamber, greater than the first measured value of the contaminant in the chamber.

4. The apparatus of claim 2, wherein the controller is configured to:
    activate the activation element when a measurement of the contaminant exceeds a first set point; and,
    deactivate the activation element when the measurement of the contaminant falls below a second set point.

5. The apparatus of claim 1, wherein:
    the sensor system includes a temperature sensor;
    the condition includes a temperature of the piece of lithium-aluminum alloy; and,
    the controller is configured to:
        activate the activation element when the measurement of the temperature falls below a first set point; and,
        deactivate the activation element when the measurement of the temperature exceeds a second set point.

6. The apparatus of claim 5, wherein:
    the sensor system includes a residue sensor;
    the condition includes a measurement of a contaminant present in the chamber; and,
    the controller is configured to:
        activate the activation element when the measurement of the contaminant exceeds a set point;
        determine a target temperature according to the measurement of the contaminant; and,
        deactivate the activation element when the measurement of the temperature exceeds the target temperature.

7. The apparatus of claim 1, further comprising:
    a cooling system connected to the collection plate and arranged to reduce a temperature of the collection plate below an ambient temperature in the chamber, wherein:
    the collection plate is arranged to condense, on the collection plate, a contaminant in the chamber.

8. The apparatus of claim 1, further comprising:
    a displaceable shutter located within the chamber, wherein:
        in a first position of the displaceable shutter, the displaceable shutter blocks a direct line between the piece of lithium-aluminum alloy and the collection plate; and,
        in a second position of the displaceable shutter, the direct line is present between the piece of lithium-aluminum alloy and the collection plate.

9. The apparatus of claim 1, wherein a pressure in the chamber is less than atmospheric pressure surrounding the chamber.

10. An apparatus for purifying a controlled-pressure environment, comprising:
    a chamber arranged to be evacuated to create the controlled-pressure environment in the chamber;
    a piece of lithium-aluminum alloy located in the chamber;
    an activation element arranged to impart energy to the piece of lithium-aluminum alloy to sublimate lithium from the piece of lithium-aluminum alloy;
    a collection plate located in the chamber and arranged to form a layer of the sublimated lithium on a surface of the collection plate; and,
    a cooling system connected to the collection plate and arranged to reduce a temperature of the collection plate below an ambient temperature in the chamber, wherein:
    the collection plate is arranged to condense, on the collection plate, a contaminant in the chamber.

11. The apparatus of claim 10, further comprising:
    a feedback control system including;
        a residue sensor arranged to measure a contaminant in the chamber; and,
        a controller in communication with the sensor and configured to control operation of the activation element according to a measurement of the contaminant.

12. The apparatus of claim 10, further comprising:
    a displaceable shutter located within the chamber, wherein:
        in a first position of the displaceable shutter, the displaceable shutter blocks a direct line between the piece of lithium-aluminum alloy and the collection plate; and,
        in a second position of the displaceable shutter, the direct line is present between the piece of lithium-aluminum alloy and the collection plate.

13. The apparatus of claim 10, wherein a pressure in the chamber is less than atmospheric pressure surrounding the chamber.

14. A vacuum pump, comprising:
an inlet;
an outlet;
a flow path from the inlet to the outlet;
a pumping mechanism configured flow gas through the flow path and reduce a pressure of the flowing gas; and,
a purifying system including:
a piece of lithium-aluminum alloy; and,
an activation element arranged to impart energy to the piece of lithium-aluminum alloy to sublimate lithium from the piece of lithium-aluminum alloy into the flow path.

15. A method for purifying a controlled-pressure environment in a chamber using an apparatus including an activation element and a feedback control system, comprising:
evaluating, using a sensor system in the feedback control system, a condition in the chamber;
imparting, using the activation element, energy to a piece of lithium-aluminum alloy located in the chamber;
controlling, using a controller in the feedback control system, the imparting of the energy to the piece of lithium-aluminum alloy according to evaluation of the condition;
sublimating lithium from the piece of lithium-aluminum alloy;
forming a layer of the sublimated lithium on a collection plate located in the chamber; and,
reacting the sublimated lithium with the contaminant.

16. The method of claim 15, wherein evaluating the condition includes measuring, using a residue sensor in the sensor system, a contaminant in the chamber.

17. The method of claim 16, further comprising:
operating, using the controller, the activation element to impart a first magnitude of energy to the piece of lithium-aluminum alloy for a first measured value, from the residue sensor, of the contaminant in the chamber; and,
operating, using the controller, the activation element to impart a second magnitude of energy, greater than the first magnitude of energy, to the piece of lithium-aluminum alloy for a second measured value, from the residue sensor, of the contaminant in the chamber, greater than the first measured value of the contaminant in the chamber.

18. The method of claim 16, further comprising:
activating, using the controller, the activation element when a measurement of the contaminant exceeds a first set point; and,
deactivating, using the controller, the activation element when the measurement of the contaminant falls below a second set point.

19. The method of claim 16, wherein evaluating the condition includes measuring, using a temperature sensor in the sensor system, a temperature of the piece of lithium-aluminum alloy, the method further comprising:
activating, using the controller, the activation element when the measured presence exceeds a set point;
determining, using the controller, a target temperature according to the measured presence; and,
deactivating, using the controller, the activation element when the measured temperature exceeds the target temperature.

20. The method of claim 15, wherein evaluating the condition includes measuring, using a temperature sensor in the sensor system, a temperature of the piece of lithium-aluminum alloy, the method further comprising:
activating, using the controller, the activation element when a measured temperature of the piece of lithium-aluminum alloy falls below a first set point; and,
deactivating, using the controller, the activation element when the measured temperature of the piece of lithium-aluminum alloy exceeds a second set point.

21. The method of claim 15, further comprising:
cooling the collection plate to a temperature below an ambient temperature in the chamber; and,
condensing, on the collection plate, a contaminant in the chamber.

22. The method of claim 15, further comprising:
displacing a shutter located within the chamber to a first position;
intercepting, with the shutter, material emitted from the piece of lithium-aluminum alloy to prevent the material from reaching the collection plate; and,
displacing the shutter to a second position in which a direct line is present between the piece of lithium-aluminum alloy and the collection plate to enable the sublimated lithium to reach the collection plate.

23. The method of claim 15, further comprising:
reducing a pressure in the chamber to below atmospheric pressure surrounding the chamber.

24. The method of claim 15, further comprising:
flowing a gas through the chamber; or,
not flowing a gas through the chamber.

25. A method for purifying a controlled-pressure environment in a chamber using an apparatus including an activation element, a collection plate located in the chamber, and a cooling system, comprising:
evacuating the chamber to create the controlled-pressure environment in the chamber;
imparting, using the activation element, energy to a piece of lithium-aluminum alloy located in the chamber;
sublimating lithium from the piece of lithium-aluminum alloy;
forming a layer of the sublimated lithium on the collection plate;
cooling, using the cooling system, the collection plate to a temperature below an ambient temperature in the chamber;
condensing, on the collection plate, a first contaminant in the chamber; and,
reacting the sublimated lithium with a first contaminant or a second contaminant in the chamber.

26. The method of claim 25, further comprising:
measuring, using a residue sensor for a feedback control system, a contaminant in the chamber; and,
controlling, using a controller, for the feedback system in communication with the residue sensor, operation of the activation element according to a measurement of the contaminant.

27. The method of claim 25, further comprising:
displacing a shutter located within the chamber to a first position;
intercepting, with the shutter, material emitted from the piece of lithium-aluminum alloy to prevent the material from reaching the collection plate; and,
displacing the shutter to a second position in which a direct line is present between the piece of lithium-aluminum alloy and the collection plate to enable the sublimated lithium to reach the collection plate.

28. The method of claim 25, further comprising:
reducing a pressure in the chamber to below atmospheric pressure surrounding the chamber.

29. The method of claim 25, further comprising:
flowing a gas through the chamber; or,
not flowing a gas through the chamber.

30. A method of operating a vacuum pump, comprising:
flowing gas through a flow path from an inlet of the vacuum pump to an outlet of the vacuum pump;
reducing a pressure of the flowing gas;
imparting energy to a piece of lithium-aluminum alloy;
sublimating lithium from the piece of lithium-aluminum alloy into the flow path; and,
reacting a contaminant in the flowing gas with the sublimated lithium.

* * * * *